(12) United States Patent
Park et al.

(10) Patent No.: US 8,847,204 B2
(45) Date of Patent: Sep. 30, 2014

(54) GERMANIUM ELECTROLUMINESCENCE DEVICE AND FABRICATION METHOD OF THE SAME

(71) Applicants: Seoul National University R&DB Foundation, Seoul (KR); The Board of Trustees of the Leland Stanford Junior University, Palo Alto, CA (US)

(72) Inventors: Byung-Gook Park, Seoul (KR); James S. Harris, Jr., Stanford, CA (US); Seongjae Cho, Seoul (KR)

(73) Assignees: Seoul National University R&DB Foundation, Seoul (KR); The Board of Trustees of the Leland Standford Junior University, Palo Alto, CA (US)

( * ) Notice: Subject to any disclaimer, the term of this patent is extended or adjusted under 35 U.S.C. 154(b) by 0 days.

(21) Appl. No.: 13/776,879

(22) Filed: Feb. 26, 2013

(65) Prior Publication Data

US 2014/0239324 A1 Aug. 28, 2014

(51) Int. Cl.
*H01L 29/06* (2006.01)
*H01L 31/0328* (2006.01)
*H01L 31/0336* (2006.01)
*H01L 31/072* (2012.01)
*H01L 31/109* (2006.01)
*H01L 33/00* (2010.01)

(52) U.S. Cl.
CPC .................................. *H01L 33/002* (2013.01)
USPC ........... 257/21; 257/22; 257/94; 257/E31.095

(58) Field of Classification Search
USPC ......... 257/17, 20, 21, 22, 94, 96, 97, E31.095
See application file for complete search history.

(56) References Cited

U.S. PATENT DOCUMENTS 5,917,195 A 6/1999 Brown
2012/0287959 A1* 11/2012 Tani et al. .................. 372/45.01

* cited by examiner

*Primary Examiner* — Hoai V Pham
(74) *Attorney, Agent, or Firm* — Gerald E. Hespos; Michael J. Porco; Matthew T. Hespos

(57) ABSTRACT

This invention provides a germanium electroluminescence device and a fabricating method of the same for using germanium of an indirect bandgap semiconductor without modifying a bandgap as a light-emitting layer which emits a 1550 nm-wavelength light and enabling to use not only as infrared LEDs itself but also as light sources for optical communication systems.

12 Claims, 5 Drawing Sheets

GERMANIUM ELECTROLUMINESCENCE DEVICE AND FABRICATION METHOD OF THE SAME

BACKGROUND OF INVENTION

1. Field of the Invention

The present invention relates to electroluminescence devices and more particularly to germanium electroluminescence devices operated by a Γ-valley transport across a heterojunction and fabricating methods of the same.

2. Description of the Related Art

An electroluminescence device is an optoelectronic device for converting electrical energy into light energy such as a light emitting diode (LED).

When a voltage is applied to both ends of a specific material layer (a light-emitting layer) of an electroluminescence device, electrons injected into a conduction band of a light-emitting layer are transited and recombined with holes in a valance band. At this time, by energy conservation, it emits a light corresponding to a transited energy bandgap (hereafter, simply called "a bandgap").

To obtain transitions of electrons from a conduction band of a light-emitting layer to a valance band, momentum must be conserved before and after each transition.

On the other hand, energies of the conduction and valance bands are changed by the electron-moving direction in a lattice and are expressed to an energy (E)-wave number (k) diagram with a conduction band minimum and a valance band maximum In an E-k diagram, a conduction band minimum and a valence band maximum are dependent on semiconductor materials and have the same k value or different k values. The former represents direct bandgap semiconductors and the latter represents indirect bandgap semiconductors.

In other words, conduction band minimums and valence band maximums of direct bandgap semiconductors (e.g., GaAs, GaN, etc.) exist at the Γ-point having k=0, while in indirect bandgap semiconductors (e.g., Si, Ge, etc.), valence band maximums exist at the Γ-point but conduction band minimums exist at the other points (points forming an X- or L-valley).

As the above mentioned, because momentum must be conserved before and after each transition to obtain transitions between the bands, the transited electrons have to get the same k value in the E-k diagram before and after each transition.

For this reason, electroluminescence devices have mainly formed a light-emitting layer with direct bandgap semiconductors until now.

By the way, the conventional electroluminescence devices using direct bandgap semiconductors have some problems. First, the manufacturing cost is too high to grow a light-emitting layer with direct bandgap compound semiconductors on a costly compound semiconductor substrate. Second, the conventional electroluminescence devices cannot be integrated together with common circuit elements generally fabricated on a silicon substrate.

Recently, studies on light-emitting layers based on silicon having an indirect bandgap or germanium enabling to easily grow on silicon are being actively progressed.

However, the studies until now are pursued with the objective of modifying the bandgap structure from the indirect bandgap to the direct bandgap by tensile and compressive strains through applying physical forces or injecting atoms with each other different size to silicon or germanium.

For example, U.S. Pat. No. 5,917,195 discloses a technology for a light emission by recombining between holes located at valence band maximum and electrons transported from an X-valley to a Γ-valley through changing the energy and momentum of electrons by lattice resonators such as phonon resonators in several resonating layers made with the radioactive isotopes of silicon $Si^{28}$, $Si^{29}$ and $Si^{30}$. In this case, there are difficult processes to form several resonating layers using the radioactive isotopes of silicon $Si^{28}$, $Si^{29}$ and $Si^{30}$.

And according to non-patent reference (Meng Liu et al, Band-Engineered Ge-on-Si Lasers, IEDM, pp. 146-149, 2010), a lattice structure of germanium of an indirect bandgap semiconductor is modified by a tensile strain for changing an energy band of conduction band, in other word, for regulating to raise the X-valley having a conduction band minimum and to come down the Γ-valley at k=0 to the similar energy of the X-valley, and then some electrons injected by doping of n-type impurities enable the transport into the Γ-valley for recombining with holes located at a valence band maximum. In this case, difficult processes to especially modify a lattice structure for forming a light-emitting layer with an indirect bandgap semiconductor are required.

Because the above mentioned conventional methods are commonly based on complex processes and are difficult to make mass productions possible, new electroluminescence device structures and fabricating methods of the same are needed to enable indirect bandgap material layer to be used as a light-emitting layer.

Specially, when a light-emitting layer is formed of germanium without modifying the bandgap, it generates a light with a wavelength 1550 nm which is little absorbed to a silicon oxide (silica) material of an optical communication. Accordingly, germanium can be used such as an infrared LED itself and a light source of an optical communication too. Thus, new germanium electroluminescence device structures and fabricating methods of the same are greatly needed.

SUMMARY OF THE INVENTION

The present invention is directed to provide new germanium electroluminescence device structures and fabricating methods of the same for using germanium itself without modifying a bandgap as a light-emitting layer.

To achieve the objective, a germanium electroluminescence device according to the present invention, comprising: a semiconductor substrate; a light-emitting layer formed with p-type germanium on the semiconductor substrate; and an electron transport layer formed of an n-type direct bandgap semiconductor layer by a heterojunction on the light-emitting layer for transporting electrons to a Γ-valley of the germanium.

Here, it is preferred that the semiconductor substrate is a p-type germanium substrate formed in one body with the same material as the light-emitting layer or that the semiconductor substrate is a p-type silicon substrate and a p-type silicon germanium layer is further formed between the silicon substrate and the light-emitting layer.

Preferably, the electron transport layer is formed with $Al_xGa_{1-x}As$ and the mole fraction x of aluminum (Al) is $0.2 \leq x \leq 0.4$.

An intrinsic semiconductor layer undoped with impurities can be further formed between the light-emitting layer and the electron transport layer.

Preferably, the intrinsic semiconductor layer is a material layer having the same composition as the electron transport layer.

An n-type cladding layer can be further formed on the electron transport layer, an n-side contact can be formed on the cladding layer and a p-side contact can be formed on the semiconductor substrate or the light-emitting layer.

The light emitting, intrinsic semiconductor, electron transport and cladding layers can be formed into a projected pillar structure, the n-side contact can be formed into a circle ring structure with a transparent electrode or an opaque metal electrode on the upper portion of the pillar structure, and the p-side contact can be formed into a circle ring structure to encircle the lower portion of the pillar structure at a regular interval, thereby it is possible to form a shape of a hand lantern.

On the other hand, a method for fabricating a germanium electroluminescence device according to the present invention, comprising: a first step of forming a $p^+$-type light-emitting layer by doping p-type impurities into a germanium substrate; a second step of epitaxially growing an intrinsic semiconductor layer, an $n^+$ electron transport layer and an $n^+$ cladding layer orderly on the germanium substrate; a third step of forming an etching mask on the cladding layer and forming an active region projected on the germanium substrate with using the etching mask to etch the cladding layer, the electron transport layer, the intrinsic layer and the germanium substrate by an anisotropic dry etching; and a fourth step of forming n- and p-side contacts on the upper portion of the active region and the germanium substrate, respectively.

Here, an upper surface of the germanium substrate has preferably a tilted surface to minimize the lattice mismatch with the next layer, e.g. an (001) plane with 4° more off-cut toward the [111] direction.

Before the first step, it can further comprise the steps of: forming a buffer layer with silicon germanium by discontinuously or continuously adding germanium content on a silicon substrate, and epitaxially growing the germanium substrate on the buffer layer of silicon germanium.

It is preferred that the cladding layer is formed with GaAs, and that the intrinsic semiconductor and electron transport layers are formed with $Al_xGa_{1-x}As$, where the mole fraction (x) of aluminum (Al) is $0.2 \leq x \leq 0.4$.

The second step is preferably carried out with epitaxially growing of the intrinsic semiconductor, $n^+$ electron transport and $n^+$ cladding layers sequentially without exposure to air between layer growths.

The active region can be projected as a pillar structure and in the third step, the light-emitting layer can be formed with a part of the germanium substrate by the anisotropic dry etching.

The germanium substrate and the light-emitting layer can be doped with $1 \times 10^{18} \sim 2 \times 10^{18}/cm^3$ of p-type impurities, respectively, and the cladding and electron transport layers can be doped with $3 \times 10^{18} \sim 4 \times 10^{18}/cm^3$ and $4 \times 10^{18} \sim 5 \times 10^{18}/cm^3$ of n-type impurities by in-situ doping, respectively.

The germanium electroluminescence device according to the present invention is including a light-emitting layer formed of p-type germanium of an indirect bandgap material having a local conduction-band minimum at the Γ-point and an electron transport layer formed of an n-type direct bandgap semiconductor layer by a heterojunction on the light-emitting layer for transporting electrons to a Γ-valley of the light-emitting layer. Thus, the present invention enables to obtain a valuable light with a wavelength corresponding to the Γ-valley bandgap of germanium.

In the present invention, the electrons transported from the $Al_xGa_{1-x}As$ layer do not see an energy barrier toward the germanium layer while the transport layer and the intrinsic semiconductor layer are maintained as a direct-bandgap material if the Al fraction x is adjusted within the range of $0.2 \leq x \leq 0.4$. Thus, the present invention enables to improve a Γ-valley transport efficiency of electrons across a heterojunction by forming the Γ-valley of a direct bandgap material and removing an energy barrier occurred in a heterojunction.

On the other hand, the fabricating method of germanium electroluminescence device according to the present invention is including the steps of: forming a $p^+$ light-emitting layer with a germanium substrate itself without modifying a bandgap, epitaxially growing intrinsic semiconductor, $n^+$ electron transport and $n^+$ cladding layers orderly by metal-organic chemical vapor deposition (MOCVD), etc., on the light-emitting layer, forming an active region with a required shape by etching, and forming n- and p-side contacts. Thus, the fabricating method of present invention enables to reduce fabrication costs significantly due to a simple fabricating process, to make mass productions possible, and to integrate conventional CMOS circuit elements and optoelectronic devices simultaneously for various applications.

In these drawings, the following reference numbers are used throughout: reference number 10 indicates a germanium substrate, 12 a light-emitting layer, 14 an etched substrate, 20 and 22 an intrinsic semiconductor layer, 30 and 32 an electron transport layer, 40 and 42 a cladding layer, 50 an etching mask, 60 an n-side contact, 70 a p-side contact, and 100 an active region of a pillar structure.

DETAILED DESCRIPTION OF THE PREFERRED EMBODIMENTS

Detailed descriptions of preferred embodiments of the present invention are provided below with respect to accompanying drawings.

The present invention is directed to provide a germanium electroluminescence device using germanium itself without modifying a bandgap as a light-emitting layer which emits a 1550 nm-wavelength light for applications such as not only infrared LEDs itself but also signal light sources of optical communication systems.

By the way, since germanium is an indirect bandgap material, there has been a difficult problem that it must be modified a bandgap for using as a light-emitting layer.

Figure 6:
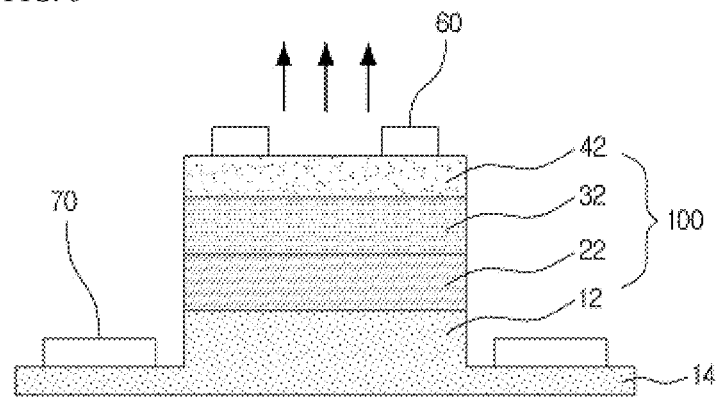
FIG. 6 is a cross sectional view penetrating the center of FIG. 5

To solve the problem, a germanium electroluminescence device according to an embodiment of the present invention, as shown in FIG. 6, basically comprising: a semiconductor substrate; a light-emitting layer 12 formed with p-type germanium on the semiconductor substrate; and an electron transport layer 32 formed of an n-type direct bandgap semiconductor layer by a heterojunction on the light-emitting layer for transporting electrons to the Γ-valley of the germanium.

This embodiment uses germanium without modifying a bandgap as a p-type light-emitting layer 12 for obtaining the required wavelength light. On the p-type light-emitting layer 12, an p-type electron transport layer 32 is formed of a direct bandgap semiconductor layer by a heterojunction for transporting electrons injected from a power source applied through the n-type electron transport layer 32 to a Γ-valley having a local conduction-band minimum at k=0 of germanium. The electrons transported into the Γ-valley of germanium are recombined with holes accumulated in a valance band maximum to obtain a valuable light with a wavelength corresponding to the Γ-valley bandgap of germanium.

Namely, a light is emitted during recombining holes with the electrons transited between bands. By the energy equation, the wavelength of the light is calculated as 1240/0.8=1550 nm, where 0.8 eV is the Γ-valley bandgap of germanium.

Each component of the embodiment can be practically and variously applied as the following.

First, the semiconductor substrate, as shown in FIG. 6, can be a p-type germanium substrate 14 formed in one body with the same material as the p-type light-emitting layer 12.

In other example, since germanium has relatively higher compatibility with silicon, the semiconductor substrate can be formed of a p-type silicon substrate (not shown), and a p-type silicon germanium layer (not shown) can be further formed between the p-type silicon substrate and the p-type light-emitting layer.

In this case, it is advantageous to integrate an optoelectronic device with a circuit element for regulating an operation of the optoelectronic device on the silicon substrate.

And the n-type electron transport layer 32 can be directly formed on the p-type light-emitting layer 12. Preferably, as shown in FIG. 6, the n-type electron transport layer 32 can be formed by interlaying an intrinsic semiconductor layer 22 undoped with impurities for improving an electrical reliability (against a high electric field between p- and n-type junctions) and a heterojunction status with the p-type light-emitting layer 12.

At this time, the intrinsic semiconductor layer 22 is preferably a material layer having the same composition as the electron transport layer 32.

And an n-side contact 60 can be directly formed on the electron transport layer 32. Preferably, as shown in FIG. 6, an n-type cladding layer 42 is further formed on the electron transport layer 32 as a protecting layer and then the n-side contact 60 is formed on the cladding layer 42 for protecting an infiltration of an electrode material of the n-side contact into the electron transport layer 32 and obtaining lower ohmic resistance, etc.

On the other hand, a p-side contact 70 can be directly formed on the p-type light-emitting layer 12. Preferably, as shown in FIG. 6, the p-side contact 70 is formed on a p-type germanium substrate 14 formed in one body with the p-type light-emitting layer 12 or on a p-type silicon substrate (not shown) electrically connected to the p-type light-emitting layer 12.

And for efficiently achieving the objective of the present invention, the n-type electron transport layer 32 and the intrinsic semiconductor layer 22 are preferably formed of materials meeting the conditions as the following.

First, for easily transporting electrons from Γ- to Γ-valley, when a forward-biased voltage $V_f$ is applied between the n- and p-side contacts 60 and 70 (an ON state of a germanium electroluminescence device), the Γ-valley conduction bands of the n-type electron transport layer 32 and/or the intrinsic semiconductor layer 22 are raised up and have to be formed at higher level than the Γ-valley conduction band of the p-type light emitted layer 12. While, holes accumulated in the p-type light-emitting layer 12 have not to be leaked toward the n-type electron transport layer 32 or the intrinsic semiconductor layer 22 through the heterojunctions even if the valance band of the p-type light-emitting layer 12 is lowered.

To meet the mentioned conditions, a bandgap of an direct bandgap semiconductor layer such as the n-type electron transport layer 32 and the intrinsic semiconductor layer 22 is needed to be larger than the Γ-valley bandgap which is the difference between a Γ-valley minimum and a valance band maximum of an indirect bandgap semiconductor layer such as the p-type light-emitting layer 12.

If the conditions are satisfied, electrons injected into a Γ-valley conduction band of the p-type light-emitting layer 12 are not experienced a potential energy barrier in the heterojunction during the Γ-to-Γ transport. The holes accumulated in a valance band of the p-type light-emitting layer 12 cannot be leaked across the heterojunction because of the energy barrier according to the difference between valance band maximums of both side materials of the heterojunction. And a light generated by recombining holes with electrons transited to the Γ-valley bandgap in the p-type light-emitting layer 12 is radiated to the outside without absorbing into and by passing through the n-type electron transport layer 32 and/or the intrinsic semiconductor layer 22 having wider bandgaps.

And electrons transported from Γ- to Γ-valley is possible to be leaked due to traps, etc. occurring in junction interfaces between the p-type light-emitting layer 12, the electron transport layer 32 and the intrinsic semiconductor layer 22. To prevent the leakage of the transported electrons effectively, a lattice mismatch between both material layers is preferably 1% or less.

Therefore, the electron transport layer 32 and the intrinsic semiconductor layer 22 are preferably formed of an aluminum-gallium-arsenide compound $(Al_xGa_{1-x}As)$ by adding aluminum (Al) to gallium (Ga) with using gallium arsenide (GaAs) as a start material. The mole fraction x of an aluminum component is more preferably adjusted to meet the above conditions.

For example, to remove the energy barrier in a heterojunction during the Γ-to-Γ transport of electrons, the mole fraction x of the aluminum component can be adjusted to meet the condition of Equation (1).

$$\chi_{Ge\Gamma} - \chi_{Al_xGa_{1-x}As} = 3.86 - (4.07 - 1.1x) \geq 0 \quad (1)$$

Where $\chi_{Ge\Gamma}$ is a Γ-valley electron affinity of germanium and 4.0 eV (an L-valley electron affinity)−[0.8 eV (a Γ-valley bandgap)−0.66 eV (an L-valley bandgap)]=3.86 eV, $\chi_{AlxGal\text{-}xAs}$ is an electron affinity of an aluminum-gallium-arsenide compound (Al$_x$Ga$_{1-x}$As) and 4.07-1.1x (eV), and x is a mole fraction of an aluminum component.

And because the aluminum-gallium-arsenide compound (Al$_x$Ga$_{1-x}$As) must be a direct bandgap semiconductor material, the mole fraction x of the aluminum component should simultaneously meet the condition of Equation (2).

$$x \leq 0.4 \quad (2)$$

Therefore, it is preferable that the mole fraction x of the aluminum component is 0.2≤x≤0.4.

In other words, when the mole fraction x of the aluminum component is out of the range by x>0.4, the aluminum-gallium-arsenide compound (Al$_x$Ga$_{1-x}$As) becomes an indirect bandgap semiconductor having a conduction band minimum at the X-valley. In this case, when a voltage is applied, electrons should be firstly filled into the X-valley instead of the Γ-valley. Accordingly, there has a problem that it is difficult to transport the electrons by a Γ-to-Γ transport required in the present invention.

And in the case of x<0.2, by a negative Γ-valley offset in the heterojunction, the Γ-valley conduction band minimum of germanium should be higher than the Γ-valley conduction band minimum of the aluminum-gallium-arsenide compound (Al$_x$Ga$_{1-x}$As). Accordingly, electrons are experienced an energy barrier in the heterojunction during a Γ-to-Γ transport. Thus, there is a problem that it is difficult to embody an efficient germanium electroluminescence device.

Figure 5:
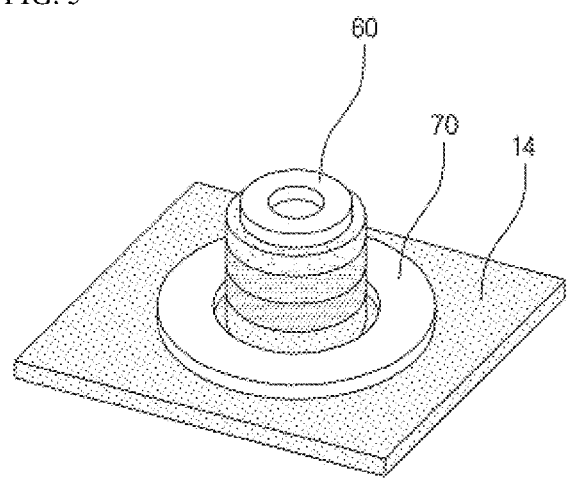

The germanium electroluminescence devices meeting the above conditions can be fabricated into various structures. Preferably, as shown in FIGS. 5 and 6, the p-type light emitting, intrinsic semiconductor, n-type electron transport and n-type cladding layers 12, 22, 32 and 42 are formed into a projected pillar structure 100, the n-side contact 60 is formed into a circle ring structure with a transparent electrode or an opaque metal electrode on the upper portion of the pillar structure 100, and the p-side contact 70 is formed into a circle ring structure to encircle the lower portion of the pillar structure 100 at a regular interval, thereby it is possible to emit a light from into the circle ring of the n-side contact 60 as a hand lantern.

Figure 7:
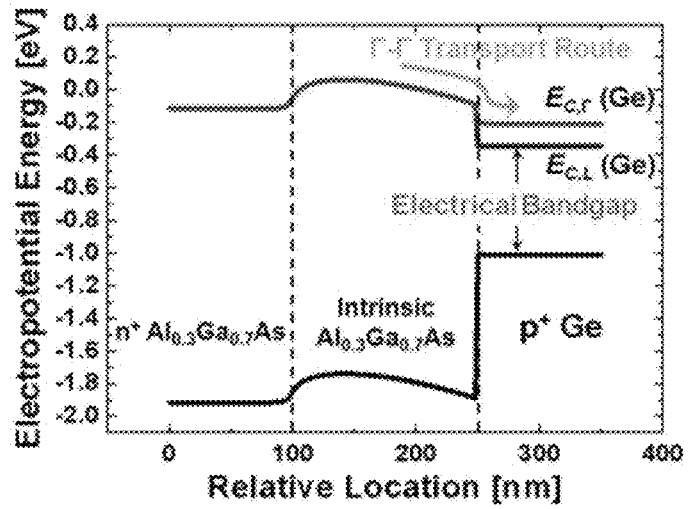
FIG. 7 is an energy-band diagram showing band changes obtained by simulation at a forward-biased voltage of 1 V applied to both ends of a light-emitting layer and an electron transport layer of a germanium electroluminescence device according to an embodiment of the present invention.
Figure 8:
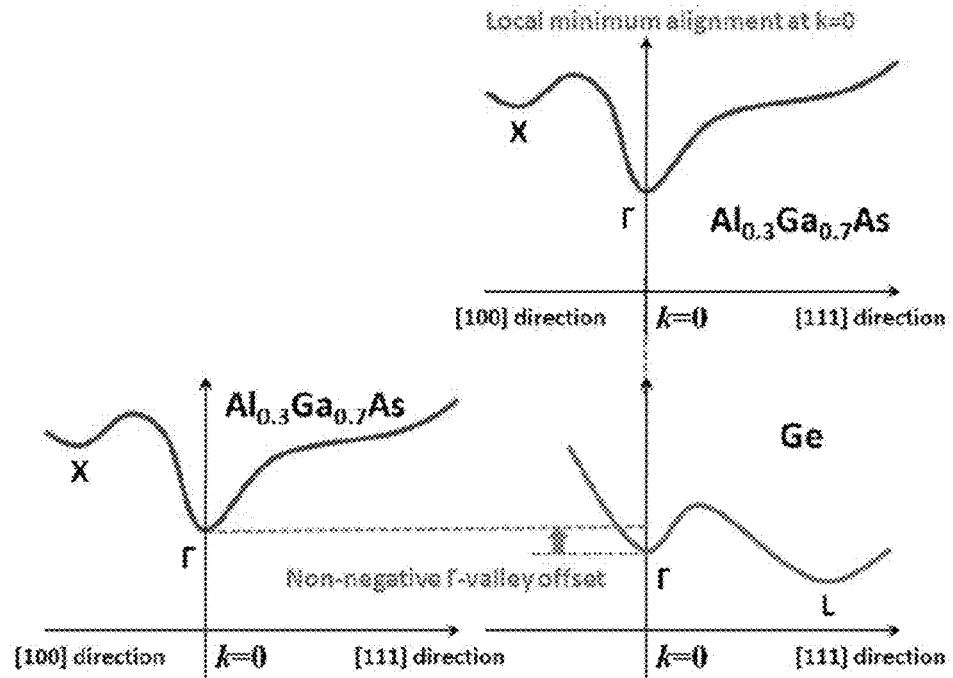
FIG. 8 is E-k diagrams showing the conditions for an electron transport from Γ- to Γ-valley across a heterojunction between a light-emitting layer and an electron transport layer of a germanium electroluminescence device according to an embodiment of the present invention.

FIGS. 7 and 8 are respectively the energy-band and E-k diagrams showing energy-band changes obtained by simulation of applying a forward-biased voltage of 1 V to both ends of the n- and p-side contacts 60 and 70 after forming an intrinsic semiconductor layer 22 and an n-type electron transport layer 32 with an aluminum-gallium-arsenide compound (Al$_{0.3}$Ga$_{0.7}$As) on a p$^+$ germanium light-emitting layer 12.

As shown in FIG. 8, because the aluminum-gallium-arsenide compound (Al$_{0.3}$Ga$_{0.7}$As) is formed by a heterojunction on the germanium light-emitting layer 12, Γ-valleys of both layers are formed at k=0. By a nonnegative Γ-valley offset between both layers, a Γ-valley conduction band minimum of Al$_{0.3}$Ga$_{0.7}$As should be higher than or equal to a Γ-valley conduction band minimum of Ge. Accordingly, electrons do not experience an energy barrier in the heterojunction during a Γ-to-Γ transport. As a result, it is possible to embody an efficient germanium electroluminescence device.

And as shown in FIG. 7, when a predetermined forward-biased voltage is applied between the n- and p-side contacts 60 and 70 in the germanium electroluminescence device having the structure shown in FIG. 6, an energy band of an n$^+$ Al$_{0.3}$Ga$_{0.7}$As electron transport layer 32 is raised up and an energy band of a p$^+$ Ge light-emitting layer 12 is lowered. The electrons injected from a power source are transported from a Γ-valley conduction band of the n$^+$ Al$_{0.3}$Ga$_{0.7}$As electron transport layer 32 via a Γ-valley conduction band of the Al$_{0.3}$Ga$_{0.7}$As intrinsic semiconductor layer 22 to a p$^+$ Ge light-emitting layer 12 through a Γ-to-Γ transport route. Accordingly, the electrons transported through the Γ-to-Γ transport route should be recombined with holes accumulated in a valance band maximum of a p$^+$ Ge light-emitting layer 12. As a result, it is possible to emit a light corresponding to the Γ-valley bandgap ($E_{C,\Gamma}$) of the p$^+$ Ge light-emitting layer 12.

Figure 9:
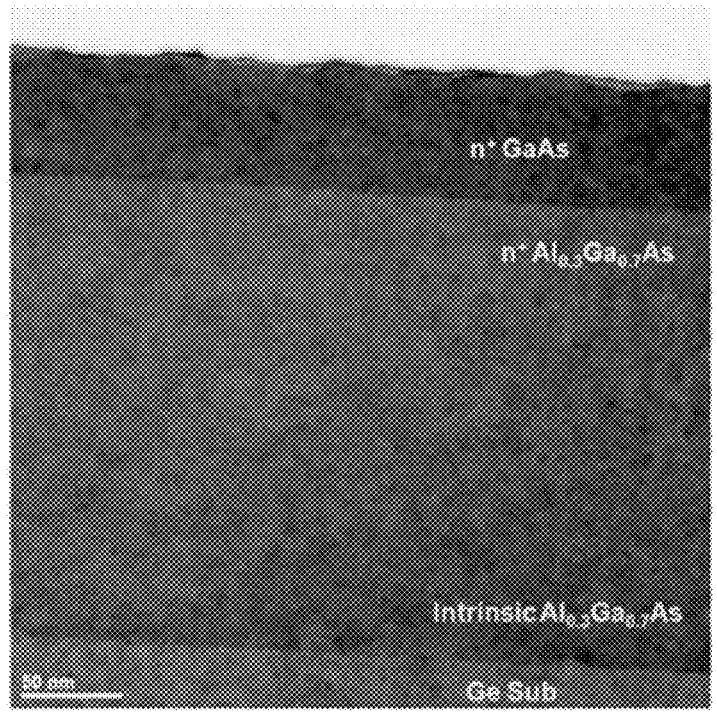
FIG. 9 is a transmission electron microscope (TEM) image showing a junction status of the $p^+$ Ge light-emitting/$Al_{0.3}Ga_{0.7}As$ intrinsic semiconductor/$n^+$ $Al_{0.3}Ga_{0.7}As$ electron transport/$n^+$ GaAs cladding layers in a germanium electroluminescence device according to an embodiment of the present invention.
Figure 10:
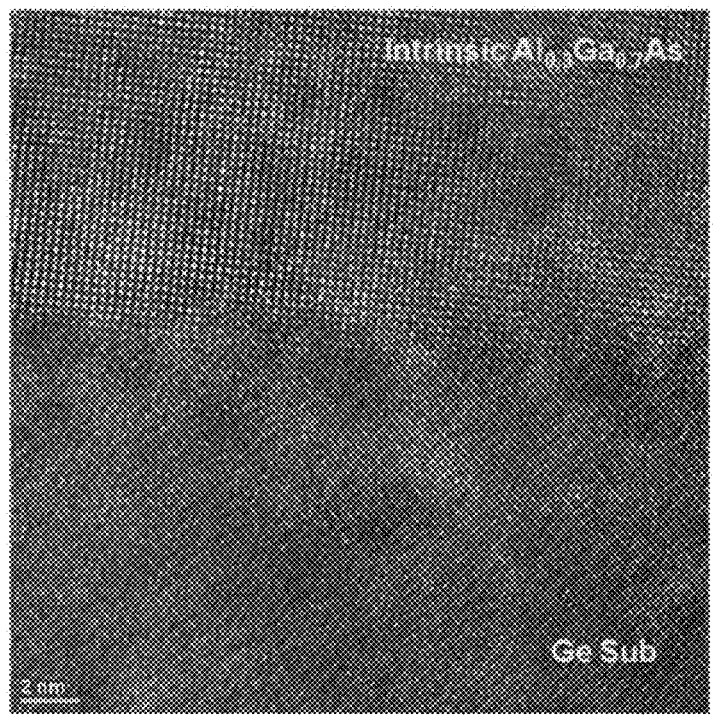
FIG. 10 is a magnified image of TEM showing a heterojunction status of the interface of the $p^+$ Ge light-emitting and $Al_{0.3}Ga_{0.7}As$ intrinsic semiconductor layers shown in FIG. 9.

FIG. 9 is a transmission electron microscope (TEM) image showing a junction status of the p$^+$ Ge substrate 14 and the p$^+$ Ge light-emitting/Al$_{0.3}$Ga$_{0.7}$As intrinsic semiconductor/n$^+$ Al$_{0.3}$Ga$_{0.7}$As electron transport/n$^+$ GaAs cladding layers 12, 22, 32 and 42 in a germanium electroluminescence device having the structure shown in FIG. 6. FIG. 10 is a magnified image of TEM showing a heterojunction status of the p$^+$ Ge substrate 14 and the p$^+$ Ge light-emitting/Al$_{0.3}$Ga$_{0.7}$As intrinsic semiconductor layers 12 and 22 of FIG. 9.

The lattice mismatches of a Ge/Al$_{0.3}$Ga$_{0.7}$As junction and a Al$_{0.3}$Ga$_{0.7}$As/GaAs junction are 0.171% and 0.047%, respectively. From FIGS. 9 and 10 obtained by practical embodiments having the above lattice mismatches, it is confirmed that any defects such as voids or atomic clusters are not found in each interface.

Figure 11:
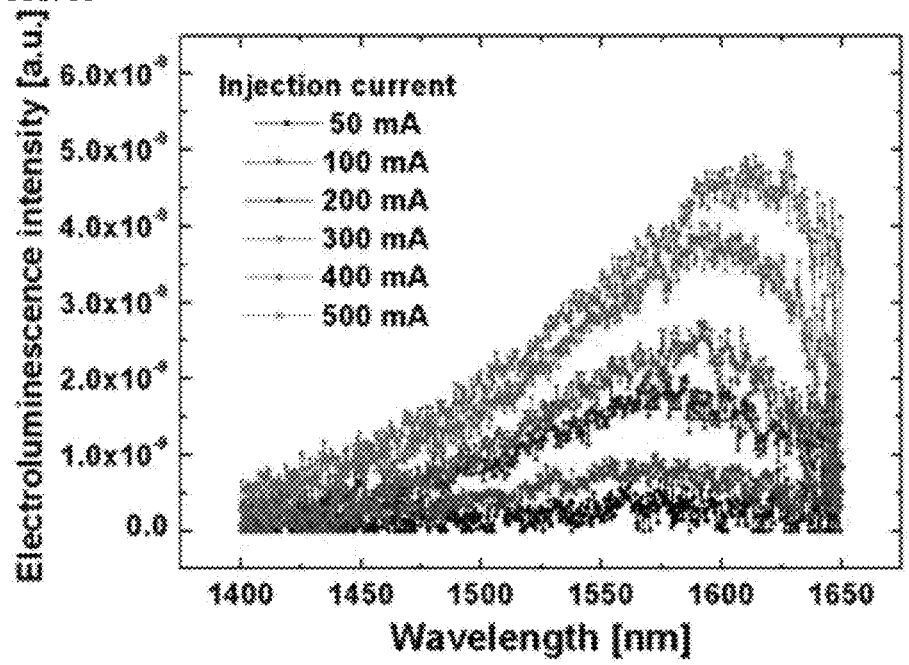
FIG. 11 is an electroluminescence output characteristic diagram analyzing wavelength versus electroluminescence intensities measured corresponding to increasing an injection current in a germanium electroluminescence device according to an embodiment of the present invention.
Figure 12:
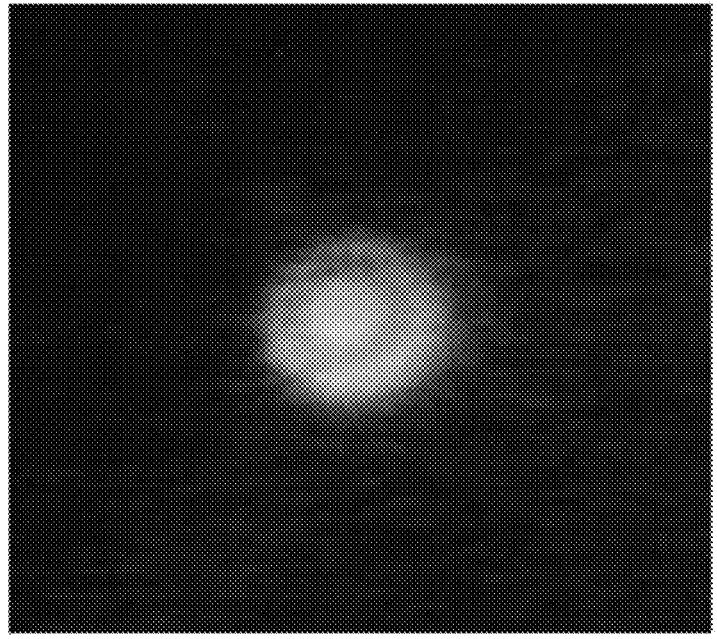
FIG. 12 is a charge coupled device (CCD) camera image showing a light emitted at a room temperature from a germanium electroluminescence device according to an embodiment of the present invention.

FIG. 11 is an electroluminescence optical power spectrum analyzing electroluminescence intensities versus wavelength measured with increasing an injection current after applying a power source to the n- and p-side contacts 60 and 70 in a germanium electroluminescence device having the structure shown in FIG. 6. FIG. 12 is a charge coupled device (CCD) camera image showing a light emitted at a room temperature from the germanium electroluminescence device having the structure shown in FIG. 6.

As expected from FIG. 11, if the injection current is small, it is observed that the electroluminescence intensity outputted from the germanium electroluminescence device has a peak value (a maximum value) at a wavelength of 1550 nm corresponding to a germanium Γ-valley bandgap. And it is also observed that the peak value is increased according to the increase of the injection current.

On the other hand, when the injection current is increased, FIG. 11 shows a redshift that the peak of the electroluminescence intensity is shifted toward a wavelength larger than 1550 nm. The redshift can be explained as the following. After the electrons injected from a power source are filled in a Γ-valley conduction band of a Ge light-emitting layer 12 by the Γ-to-Γ transport, the remained electrons are overflowed and filled in the L-valley. The electrons filled in the L-valley are recombined with holes located at the valance band maximum through a lattice vibration by heating. The redshift can be due to reduction of an effective Γ-valley bandgap of germanium by heating.

Next, detailed descriptions of preferred embodiments of fabricating methods of the mentioned germanium electroluminescence devices are provided with respect to FIGS. 1 to 5.

Figure 1:
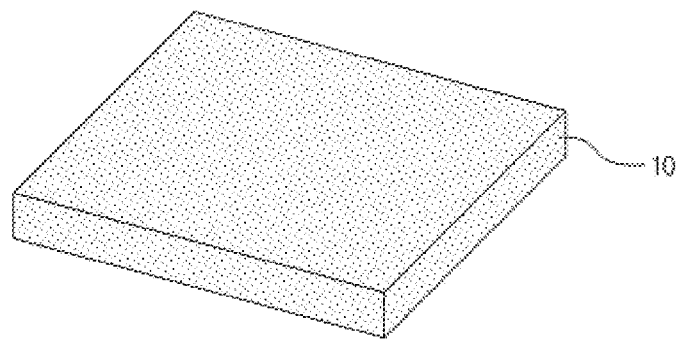
FIGS. 1 to 5 are process perspective views showing process steps of a fabricating method of a germanium electroluminescence device according to an embodiment of the present invention.

First, as shown in FIG. 1, a p$^+$ light-emitting layer is formed by doping with p-type impurities on a germanium substrate 10 (a first step)

At this time, an upper surface of the germanium substrate 10 has preferably a tilted surface to minimize the lattice mismatch with the next layer (the electron transport layer or the intrinsic semiconductor layer), e.g. an (001) plane with 4° more off-cut toward the [111] direction.

And the doping concentration of p-type impurities on the germanium substrate 10 can be 1×10$^{18}$~2×10$^{18}$/cm$^3$ for forming the p$^+$ light-emitting layer and further forming a p-side contact in a following process.

The germanium substrate 10 can be formed on a silicon substrate (not shown). In this case, before the first step, a buffer layer (not shown) of silicon germanium is formed by discontinuously or continuously adding germanium content on the silicon substrate, and then the germanium substrate 10 is epitaxially grown by doping with p-type impurities on the buffer layer of silicon germanium. Also, the germanium layer can be directly grown on the silicon substrate at a low temperature under precise control for obtaining acceptable interface status.

Figure 2:
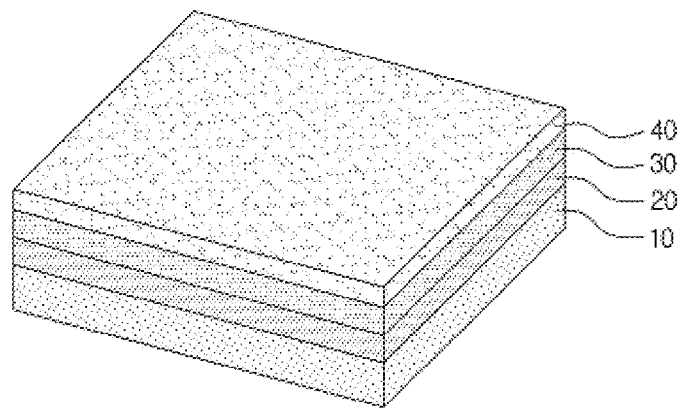

Next, as shown in FIG. 2, an intrinsic semiconductor layer 20, an electron transport layer 30 and an n$^+$ cladding layer 40 are orderly and epitaxially grown on the germanium substrate 10 (a second step).

At this time, each material layer can be grown by various methods on the germanium substrate 10. Preferably, it is carried out without exposure to air between growths of each material layer on the germanium substrate 10 without modification. Namely, the orderly growing of the intrinsic semiconductor layer 20, the electron transporting layer 30 and the cladding layer 40 can preferably reduce voids and anti-phase domains in interfaces between material layers.

Here, the process for growing the each material layer can be one of epitaxial growth methods including metal-organic chemical vapor deposition (MOCVD), reduced-pressure chemical vapor deposition (RPCVD), ultra-high vacuum chemical vapor deposition (UHV-CVD), and molecular beam epitaxy (MBE). But it is preferred to use the metal-organic chemical vapor deposition (MOCVD) that is strategic to mass production owing to its high throughput by a batch process instead of each piece process.

And, during the forming of the cladding layer 40 and the electron transport layer 30, n-type impurities can be simultaneously doped by in-situ doping to each layer with $3\times10^{18}$~$4\times10^{18}$/cm$^3$ and $4\times10^{18}$~$5\times10^{18}$/cm$^3$, respectively.

The embodied materials of the intrinsic semiconductor layer 20, the electron transporting layer 30 and the cladding layer 40, as described in the above embodiment on the germanium electroluminescence device structure of the present invention, can be formed with any direct bandgap materials only if it can easily grow with little lattice mismatch on germanium substrate 10 to form a p$^+$ light-emitting layer and can transport electrons from Γ- to Γ-valley.

However, as mentioned in the above embodiment on the structure, using gallium arsenide (GaAs) as a start material having a lattice constant of 5.65 Å very similar to that of germanium, the intrinsic semiconductor layer 20 and the electron transport layer 30 are formed of an aluminum-gallium-arsenide compound (Al$_x$Ga$_{1-x}$As) by adding aluminum (Al) to gallium (Ga). Preferably, the mole fraction x of an aluminum component is adjusted within a range of $0.2 \le x \le 0.4$ to meet the conditions of Equations (1) and (2).

And the cladding layer 40 can be formed by growing an n$^+$ GaAs on the n$^+$ Al$_x$Ga$_{1-x}$As electron transport layer 30. By eliminating aluminum (Al) from the cladding layer, any possible reaction between the contact metal and Al is avoided.

More specific example, by using the mole fraction x of aluminum component as $x=0.3$ within the range of $0.2 \le x \le 0.4$, the intrinsic semiconductor layer 20 and the electron transport layer 30 can be formed of Al$_{0.3}$Ga$_{0.7}$As.

As the above mentioned, when the intrinsic semiconductor layer 20 and the electron transport layer 30 are formed of Al$_{0.3}$Ga$_{0.7}$As, electrical characteristics of the energy band diagram and the E-k diagram shown in FIGS. 7 and 8 respectively can be obtained and the intrinsic semiconductor layer 20 and the electron transport layer 30 have an high-quality interface status with the p Ge substrate 10 or the n$^+$ GaAs cladding layer 40 as TEM images shown in FIGS. 9 and 10 respectively.

Figure 3:
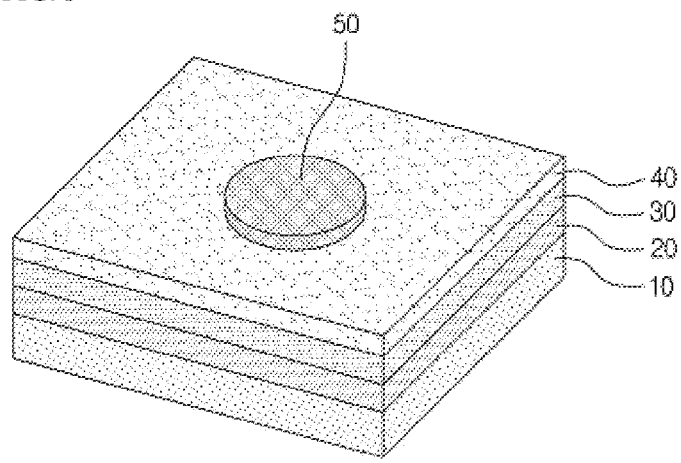
Figure 4:
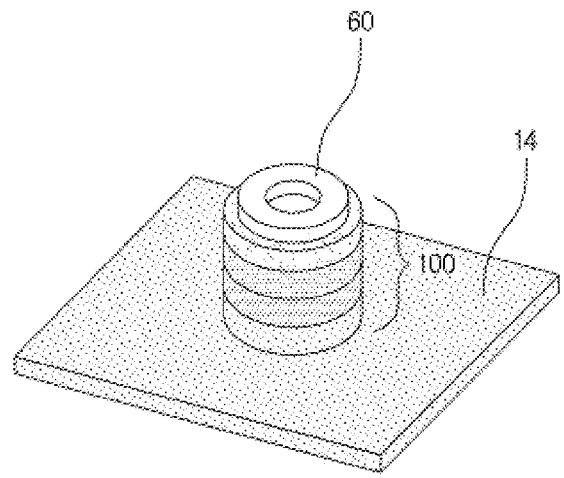

Next, as shown in FIG. 3, an etching mask 50 is formed by a photolithography on the cladding layer 40 and as shown in FIG. 4, an active region 100 projected as a mesa structure is formed on the germanium substrate 10 with using the etching mask 40 to etch the cladding layer 40, the electron transport layer 30, the intrinsic layer 20 and the germanium substrate 10 by an anisotropic dry etching of BCl$_3$ plasma, etc. (a third step).

At this time, the active region 100 can be projected as various structures. Preferably, the active region 100 is projected as a pillar structure as shown in FIG. 4 and in the third step, a light-emitting layer 10 can be formed with a part of the germanium substrate itself by the anisotropic dry etching.

Next, as shown in FIGS. 4 and 5, n- and p-side contacts 60 and 70 are formed on the upper portion of the active region 100 and the germanium substrate 14, respectively (a fourth step).

Here, the n-side contact 60 is preferably formed with a transparent electrode for emitting a light through itself from the light-emitting layer 12. But, if the n-side contact 60 is formed of an opaque metal electrode, as shown in FIG. 5, it can be preferably embodied to form a circle ring structure as a hand lantern.

And the p-side contact 70, as shown in FIGS. 5 and 6, is preferably formed into a circle ring structure to encircle the active region 100 projected as a pillar structure with metals, etc. on the etched germanium substrate 14 for current uniformly and symmetrically flowing into the n-side contact 60.

More specifically, the n- and p-side contacts 60 and 70 can be formed of multi-metal layers of Au(40 nm)/Ge(12 nm)/Ni (12 nm)/Au(200 nm) and Ti(40 nm)/Pt(40 nm)/Au(200 nm), respectively.

Through the above mentioned processes, a germanium electroluminescence device with a cross sectional structure as shown in FIG. 6 can be fabricated.

FIGS. 7 to 12 are electrical characteristics, heterojunction interface status and real light emission properties, etc. obtained from the germanium electroluminescence device with a cross sectional structure shown in FIG. 6 as one embodiment fabricated by the above-mentioned methods. Because it is sufficiently described in the above-mentioned embodiments on the structure of the present invention, the detailed descriptions are omitted.

This invention was supported by the Center for Integrated Smart Sensors funded by the Korean Ministry of Education, Science and Technology as Global Frontier Project (CISS-2012M3A6A6054186) executing from Sep. 29, 2011 to Aug. 31, 2020 for "Innovative Nano-devices Technology Development".

What is claimed is:

1. A germanium electroluminescence device comprising:
a semiconductor substrate;
a light-emitting layer formed with p-type germanium on the semiconductor substrate; and
an electron transport layer formed of an n-type direct bandgap semiconductor layer by a heterojunction on the light-emitting layer for transporting electrons to a Γ-valley of the germanium.

2. The germanium electroluminescence device of claim 1, wherein the semiconductor substrate is a p-type germanium substrate formed in one body with the same material as the light-emitting layer.

3. The germanium electroluminescence device of claim 2, wherein the electron transport layer is formed with $Al_xGa_{1-x}As$, and wherein the mole fraction x of aluminum (Al) is $0.2 \le x \le 0.4$.

4. The germanium electroluminescence device of claim 1, wherein the semiconductor substrate is a p-type silicon substrate.

5. The germanium electroluminescence device of claim 4, wherein a p-type silicon germanium layer is further formed between the silicon substrate and the light-emitting layer.

6. The germanium electroluminescence device of claim 5, wherein the electron transport layer is formed with $Al_xGa_{1-x}As$, and wherein the mole fraction x of aluminum (Al) is $0.2 \le x \le 0.4$.

7. The germanium electroluminescence device of claim 3, wherein the electron transport layer is formed with $Al_xGa_{1-x}As$, and wherein the mole fraction x of aluminum (Al) is $0.2 \le x \le 0.4$.

8. The germanium electroluminescence device of claim 1, wherein the electron transport layer is formed with $Al_xGa_{1-x}As$, and wherein the mole fraction x of aluminum (Al) is $0.2 \le x \le 0.4$.

9. The germanium electroluminescence device of claim 8, wherein an intrinsic semiconductor layer undoped with impurities is further formed between the light-emitting layer and the electron transport layer.

10. The germanium electroluminescence device of claim 9, wherein the intrinsic semiconductor layer is a material layer having the same composition as the electron transport layer.

11. The germanium electroluminescence device of claim 9, wherein an n-type cladding layer is further formed on the electron transport layer, wherein an n-side contact is formed on the cladding layer, and wherein a p-side contact is formed on the semiconductor substrate or the light-emitting layer.

12. The germanium electroluminescence device of claim 11, wherein the light emitting, intrinsic semiconductor, electron transport and cladding layers are formed into a projected pillar structure, wherein the n-side contact is formed into a circle ring structure with a transparent electrode or an opaque metal electrode on the upper portion of the pillar structure, and wherein the p-side contact is formed into a circle ring structure to encircle the lower portion of the pillar structure at a regular interval.

* * * * *